(12) United States Patent
Leung et al.

(10) Patent No.: US 11,715,813 B2
(45) Date of Patent: Aug. 1, 2023

(54) QUANTUM WELL-BASED LED STRUCTURE ENHANCED WITH SIDEWALL HOLE INJECTION

(71) Applicant: GOOGLE LLC, Mountain View, CA (US)

(72) Inventors: Benjamin Leung, Sunnyvale, CA (US); Miao-Chan Tsai, Sunnyvale, CA (US)

(73) Assignee: GOOGLE LLC, Mountain View, CA (US)

( * ) Notice: Subject to any disclaimer, the term of this patent is extended or adjusted under 35 U.S.C. 154(b) by 86 days.

(21) Appl. No.: 17/324,461

(22) Filed: May 19, 2021

(65) Prior Publication Data
US 2021/0367099 A1   Nov. 25, 2021

Related U.S. Application Data

(60) Provisional application No. 63/027,069, filed on May 19, 2020.

(51) Int. Cl.
| | |
|---|---|
| H01L 33/38 | (2010.01) |
| H01L 33/06 | (2010.01) |
| H01L 33/14 | (2010.01) |
| H01L 33/00 | (2010.01) |
| H01L 33/20 | (2010.01) |

(52) U.S. Cl.
CPC .......... *H01L 33/06* (2013.01); *H01L 33/0075* (2013.01); *H01L 33/145* (2013.01); *H01L 33/20* (2013.01); *H01L 33/385* (2013.01)

(58) Field of Classification Search
CPC ... H01L 33/0075; H01L 33/06; H01L 33/145; H01L 33/20; H01L 33/24; H01L 33/385; H01L 33/44
See application file for complete search history.

(56) References Cited

U.S. PATENT DOCUMENTS

| | | |
|---|---|---|
| 4,644,553 A | 2/1987 | Van Ruyven et al. |
| 8,026,117 B2 | 9/2011 | Kim et al. |
| 8,421,057 B2 | 4/2013 | Yan et al. |
| 9,236,548 B2 | 1/2016 | Yan et al. |
| 2002/0050590 A1 | 5/2002 | Murakami et al. |
| 2006/0273329 A1 | 12/2006 | Ohta et al. |
| 2008/0111144 A1 | 5/2008 | Fichtenbaum et al. |
| 2009/0191658 A1 | 7/2009 | Kim et al. |
| 2009/0245313 A1 | 10/2009 | Karino |
| 2010/0288998 A1 | 11/2010 | Kikuchi et al. |

(Continued)

OTHER PUBLICATIONS

International Application No. PCT/US2021/033097, International Search Report and Written Opinion dated Aug. 30, 2021, 9 pages.

*Primary Examiner* — Matthew C Landau
*Assistant Examiner* — Dmitriy Yemelyanov
(74) *Attorney, Agent, or Firm* — Brake Hughes Bellermann LLP

(57) ABSTRACT

A light emitting diode (LED) structure includes a semiconductor template having a template top-surface, an active quantum well (QW) structure formed over the semiconductor template, and a p-type layer. The p-type layer has a bottom-surface that faces the active QW and the template top-surface. The bottom-surface includes a recess sidewall. The recess sidewall of the p-type layer is configured for promoting injection of holes into the active QW structure through a QW sidewall of the active QW structure.

11 Claims, 5 Drawing Sheets

(56) References Cited

U.S. PATENT DOCUMENTS

2011/0315952 A1* 12/2011 Yan .................. H01L 33/24
                                                    438/47
2014/0361327 A1   12/2014 Chae et al.
2022/0238753 A1*  7/2022 Gruart ................ H01L 33/30

* cited by examiner

QUANTUM WELL-BASED LED STRUCTURE ENHANCED WITH SIDEWALL HOLE INJECTION

CROSS-REFERENCE TO RELATED APPLICATIONS

This application benefits from and claims priority to U.S. provisional patent application Ser. No. 63/027,069, filed May 19, 2020, the disclosure of which is incorporated herein by reference in its entirety.

TECHNICAL FIELD

Aspects of the present disclosure generally relate to light emitting structures, such as the structures of light emitting elements used in various types of displays and other devices.

BACKGROUND

The number of light emitting elements (e.g., pixels) in displays continues to increase to provide better user experiences and to enable new applications. However, increasing the number of light emitting elements is challenging from both a design perspective and a manufacturing perspective. Reducing the size of light emitting elements enables an increased density of such light emitting elements in a device. However, effective and efficient techniques for making smaller light emitting elements in large numbers and high densities are not widely available. For example, it is challenging to manufacture smaller light emitting diodes (LEDs) and incorporate such LEDs into increasingly sophisticated display architectures with stringent requirements for performance and size. Additionally, improvements are needed in light emitting characteristics of light emitting elements for display applications.

Accordingly, techniques and devices are presented herein that enable effective and efficient design and fabrication of light emitting elements and improved operation of the light emitting elements.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its purpose is to present some concepts of one or more aspects in a simplified form as a prelude to the more detailed description.

The present disclosure provides aspects of semiconductor light emitters that enable light emission over a full visible spectrum with improved efficiency. In some examples, the aspects may be applied in microLEDs. In some examples, the aspects may be applied in microLED displays. The aspects presented herein enable applications of LED technology and display technology that maintain high efficiency at reduced device sizes.

In an aspect of the disclosure, a light emitting diode (LED) structure includes a semiconductor template having a template top-surface, an active quantum well (QW) structure formed over the semiconductor template, and a p-type layer. The p-type layer has a bottom-surface that faces the active QW and the template top-surface. The bottom-surface includes a recess sidewall. The recess sidewall of the p-type layer is configured for promoting injection of holes into the active QW structure through a QW sidewall of the active QW structure.

In another aspect of the disclosure, a method for forming a QW-based LED structure on a semiconductor template is disclosed. The semiconductor template having a template top surface. The method includes forming an active quantum well (QW) structure over the template top-surface. The method also includes forming a p-type layer over the active QW. The p-type layer has a bottom-surface that faces the active QW and the template top-surface. The bottom-surface includes a recess sidewall. The method also includes injecting holes into the active QW through the non-normal surface.

In still another aspect of the disclosure, a method for forming a quantum-well-based light-emitting-diode structure on a semiconductor template is disclosed. The semiconductor template defines a plane and a surface normal with respect to the plane. The method includes injecting holes into a surface of the light-emitting-diode structure that is perpendicular to the surface normal.

BRIEF DESCRIPTION OF THE DRAWINGS

The appended drawings illustrate only some implementation and are therefore not to be considered limiting of scope.

DETAILED DESCRIPTION

Figure 1:
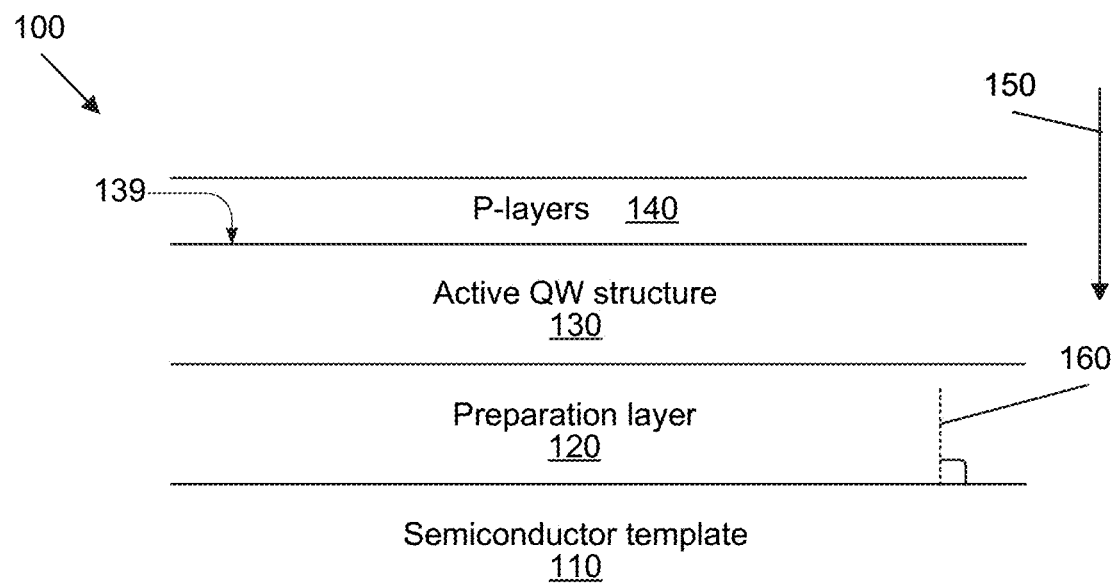
FIG. 1 illustrates an example of a quantum well-based LED structure.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known components are shown in block diagram form in order to avoid obscuring such concepts.

As used in this disclosure, the term "light emitting structure" and "light emitting element" may be used interchangeably, where the term "light emitting structure" may be used to describe a structural arrangement (e.g., materials, layers, configuration) of a single component configured to produce light of a particular color, and the terms a "light emitting element," "light emitter," or simply "emitter" may be used to more generally refer to the single component.

Increasing numbers of light emitting structures or elements (e.g., pixels) in light devices or displays may improve a user experience and enable new applications. However, it is challenging to increase the number of light emitting elements or the density of light emitting elements. A reduction in the size of light emitting structures, which enables an increase in both count and density, makes the potential use of small LEDs (e.g., micro-LEDs or nano emitters) more attractive. The currently available techniques for making small LEDs in large numbers, high densities, and capable of producing different colors (e.g., red, green, blue) are cumbersome, time consuming, costly, or result in structures with performance limitations. Accordingly, new techniques, devices, or structural configurations that enable the formation of small light emitting structures with high quality active (e.g., emitting) regions are needed.

The present disclosure provides aspects of semiconductor light emitters that enable light emission with improved efficiency. The aspects presented herein enable applications of LED technology that maintain high efficiency at reduced device sizes. In some examples, the light emitters may have a size on a micron scale or even a sub-micron scale.

As one example, III-nitride LEDs may be incorporated into a lighting or display system to cover a wide portion of the visible spectrum of light. However, the efficiency of the light emitters may drop for the emission of longer wavelengths (e.g., in the red wavelengths) and/or for smaller sizes of individual light emitters due to, for example, sidewall surface degradation, epitaxial growth issues, reduced volume of light-emitting material which are more susceptible to non-radiative processes with high carrier concentrations at desired brightness, and/or non-uniform distribution of holes throughout the quantum well structure, leading to asymmetric carrier concentrations across the active quantum well region of the light emitter.

FIG. 1 illustrates a typical LED structure 100, which is based on an active quantum well (QW) structure to produce the light emission. As shown in FIG. 1, LED structure 100 is formed on a semiconductor template 110. A preparation layer 120 is formed, deposited, or grown on semiconductor template 110 to prepare for the formation of an active QW structure 130 thereon. Preparation layer 120, for example, acts as a transitional layer providing surface step and/or morphology to improve the material characteristics of active QW structure 130 grown thereon, in comparison to if active QW structure 130 were grown directly on semiconductor template 110. A p-type layer 140 is formed on top of active QW structure 130 to provide a protective layer as well as a conductive contact layer. While preparation layer 120, active QW structure 130, and p-type layer 140 are shown in FIG. 1 as single layers, it is recognized that each one of these layers may include multiple layers of different materials to provide the functionality described above. For instance, active QW structure 130 may include one or more pairs of QW and quantum barrier (QB) layers.

Generally, the light emission characteristics of active QW structure 130 depends on injection of holes from p-type layer 140 into active QW structure 130 through the c-plane surface 139 in a c-direction 150 for a III-nitride light emitter.

In embodiments, c-plane direction 150 is parallel to a surface normal 160 defined respect to the surface of semiconductor template 110. As shown in FIG. 1, surface normal 160 is parallel to a layer stacking axis on which preparation layer 120, active QW structure 130, and p-type layer 140 are grown. However, this method of hole injection leads to a higher concentration of holes near p-type layer 140 and lower concentration of holes lower in active QW structure 130 toward preparation layer 120, thus resulting in uneven distribution of holes throughout active QW structure 130. More specifically, such problems occur when the hole mobility is lower than the electron mobility, which is the case for most semiconductor materials used for light-emitting devices and is especially prevalent in the case of the III-nitride material system. Such asymmetric carrier concentrations throughout active QW structure 130 can lead to reduced radiative recombination and reduced efficiency in light emission from LED structure 100.

Aspects of a micro LED and/or nano-LED structure are presented herein that enable higher efficiencies at a broader range of wavelengths, as well as a broader range of current densities as additional quantum wells can be incorporated into the active light emitting region, through a light emitting structure configured for sidewall hole injection of one or more quantum well layers. For example, the aspects presented herein may improve efficiency at longer wavelengths of light emission. It is noted that the device configurations and techniques disclosed herein may be applicable to any semiconductor QW structures and devices.

Figure 2:
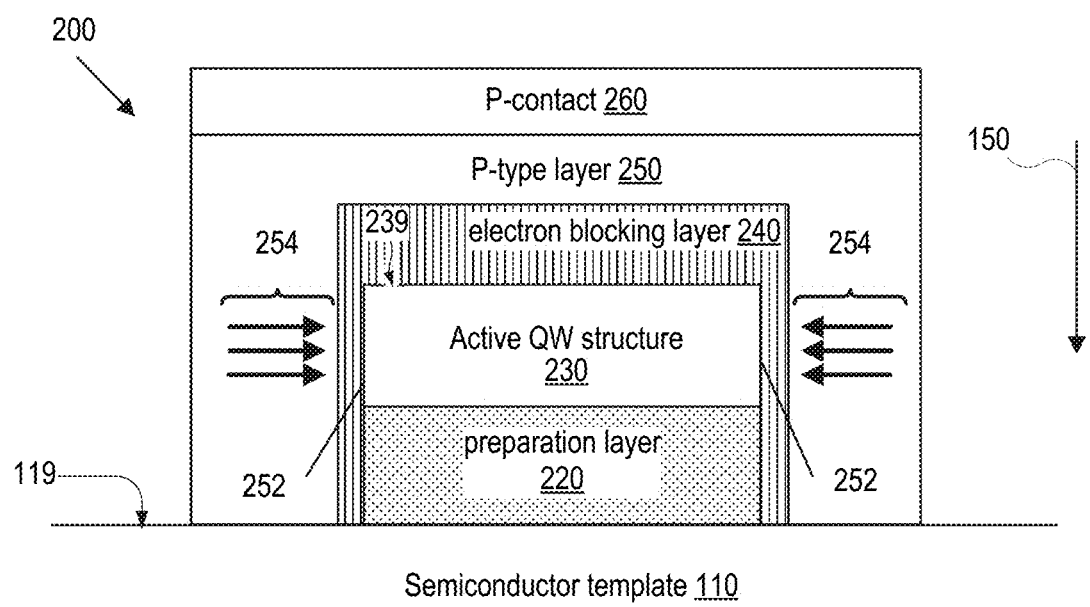
FIG. 2 illustrates an example of a quantum well-based LED structure enhanced with sidewall hole injection of the quantum well layers, in accordance with aspects of this disclosure.

FIG. 2 illustrates an example QW-based LED structure 200 enhanced by sidewall hole injection, as described herein. As shown in FIG. 2, LED structure 200 is formed on semiconductor template 110, such as a GaN template or an epitaxial layer formed on a semiconductor substrate. In some examples, techniques such as epitaxial growth and dry etch or selective area growth may be used to define the position, shape, and size of the elements of the LED structure 200.

LED structure 200 includes a preparation layer 220 formed on a top surface 119 of semiconductor template 110. In some embodiments, preparation layer 220 may be formed on the semiconductor template 110 such that one or more surfaces of preparation layer 220 is parallel to top surface 119, as shown in FIG. 2. Preparation layer 220 includes one or more layers of materials to improve the surface conditions for formation of an active QW structure 230 thereon. Active QW structure 230 includes one or more sets of a QW layer sandwiched between quantum barrier (QB) layers formed, grown, or deposited on preparation layer 220. Active QW structure 230 acts as the source of light emission for LED structure 200. For instance, five or more sets of QW/QB layers are included within active QW structure 230. 50 and more sets of QW/QB layers can be included within active QW structure 230, depending on the intended emitting wavelength and operating brightness from active QW structure 230. A variety of materials, such as InGaN, can be implemented as the QW layer, depending on the desired performance characteristics of active QW structure 230. An electron blocking layer 240 is formed around preparation layer 220 and active QW structure 230 to prevent current leakage from preparation layer 220 and active QW structure 230.

Still referring to FIG. 2, a p-type layer 250 is formed around electron blocking layer 240 to provide hole injection through sidewalls 252 of active QW structure 230 in directions indicated by arrows 254 in addition to the usual c-plane migration through a top surface 239 of active QW structure 230 in c-plane direction 150. The sidewall hole injection for QW layer 230 enables a more uniform hole distribution across active QW structure 230, which enables improvement in external quantum efficiency (EQE) of LED structure 200.

It is noted that implementation of the sidewall hole injection also allows an increased number of QW/QB pairs within QW layer 230, as well as an increase in the thickness of each QB layer, as will be discussed in further detail below. That is, sidewall hole injection allows more uniform distribution of holes throughout the entire set of QW layers within active QW structure 230 even with increased numbers of QW/QB layers and thicker QB layers, thus leading to improved LED light emission performance as well as additional device design and epitaxial growth structure flexibility. For instance, with sidewall hole injection, tens of QW/QB combination layers can be included into LED structure 200, thus providing extended design options for emission of light over a wider range of wavelengths than previously possible. Also, each QB layer can have a thickness of 50 nm or greater without a reduction in EQE characteristics of LED structure 200. Increased thickness of each QB layer may help to improve, for example, strain balance and growth morphology for the overall active QW structure 230. Finally, a p-contact 260 is formed on p-type layer 250 to provide electrical contact to LED structure 200. P-contact 260 is formed of a metal, metal alloy, or a transparent conductor, or other conductive material compatible with p-type layer 250.

In some aspects, an additional hole-blocking layer can be incorporated into the LED structure for prevention of hole migration into the preparation layer, thus improving the hole injection efficiency into the active QW structure. Two examples of LED structures including hole-blocking layers are illustrated in FIGS. 3 and 4.

Figure 3:
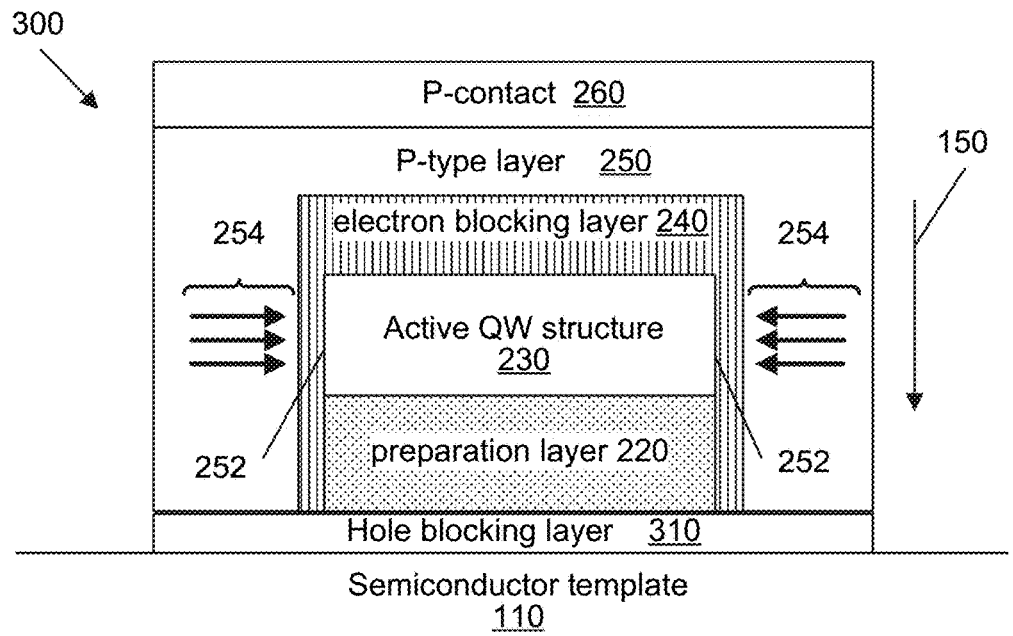
FIG. 3 illustrates another example of a quantum well-based LED structure enhanced with sidewall hole injection of the quantum well layers, in accordance with aspects of this disclosure.
Figure 4:
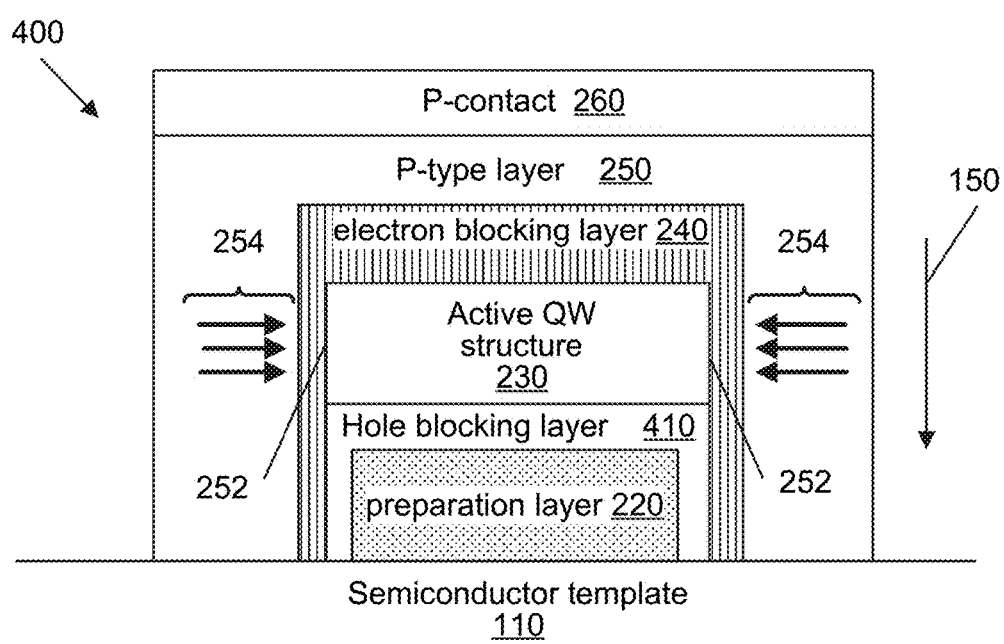
FIG. 4 illustrates still another example of a quantum well-based LED structure enhanced with sidewall hole injection of the quantum well layers, in accordance with aspects of this disclosure.

As shown in FIG. 3, in addition to the various components of LED structure 200, a LED structure 300 includes a hole-blocking layer 310 disposed between semiconductor template 110 and preparation layer 220 to prevent migration of holes into preparation layer through semiconductor template 110. Similarly, in FIG. 4, a LED structure 400 includes a hole-blocking layer 410 surrounding preparation layer 220 to prevent sidewall hole injection into preparation layer 220, thus isolating the sidewall hole injection effect to active QW structure 230. Suitable materials for the hole-blocking layers include, but are not limited to, an n-doped layer, such as an n-doped AlInGaN or AlGaN material.

Figure 5:
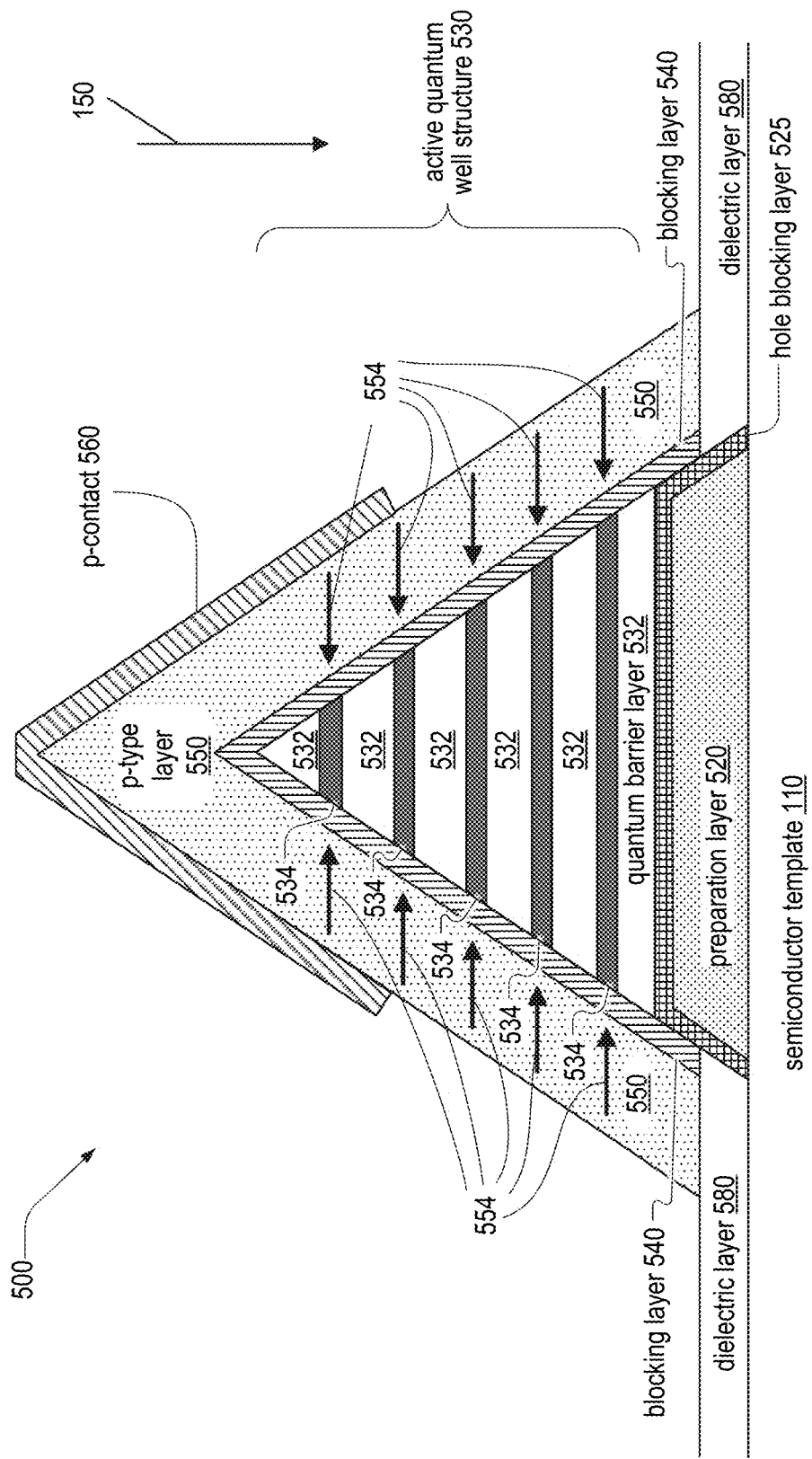
FIG. 5 illustrates yet another example of a quantum well-based LED structure enhanced with sidewall hole injection of the quantum well layers, in accordance with aspects of this disclosure.

FIG. 5 shows an exemplary embodiment of a QW-based LED structure 500 enhanced by sidewall hole injection, in accordance with an embodiment. LED structure 500 includes a preparation layer 520 formed on semiconductor template 110. The dimensions of preparation layer 520 can be defined using, for example, epitaxial growth and dry etch or selected area growth techniques. Like LED structure 400 of FIG. 4, preparation layer 520 is surrounded by a hole-blocking layer 525 to reduce hole migration into preparation layer 520. An active QW structure 530 is created by forming alternating stacks of QB layers 532 and QW layers 534 on hole-blocking layer 525 in a pyramidal shape, in the present example. Active QW structure 530 is surrounded by an electron blocking layer 540, then a p-type layer 550 is formed thereon. P-type layer 550 promotes injection of holes specifically into QW layers 534 as indicated by arrows 554, which denote a direction that is perpendicular, or has a component perpendicular, to c-plane direction 150. A p-contact 560 is formed partially over p-type layer 550 to provide electrical contact to LED structure 500. It is noted that, in the example illustrated in FIG. 5, LED structure 500 further includes a dielectric layer 580, which may be disposed on semiconductor template 110 and may abut hole blocking layer 525. In embodiments, dielectric layer 580 prevents contact between electron blocking layer 540, p-type layer 550, and semiconductor template 110, further preventing hole migration into preparation layer 520. For example, dielectric layer 580 may be configured for preventing unwanted current flow between p-type layer 550 and semiconductor template 110. As in previously discussed embodiments, p-type layer 550 enables hole injection into QW layers 534 in a direction other than c-direction 150, thus leading to greater uniformity in hole migration throughout active QW structure 530. Consequently, LED structure 500 exhibits improved EQE and light emission improvement over LED devices without a device architecture which enables sidewall hole injection.

Figure 6:
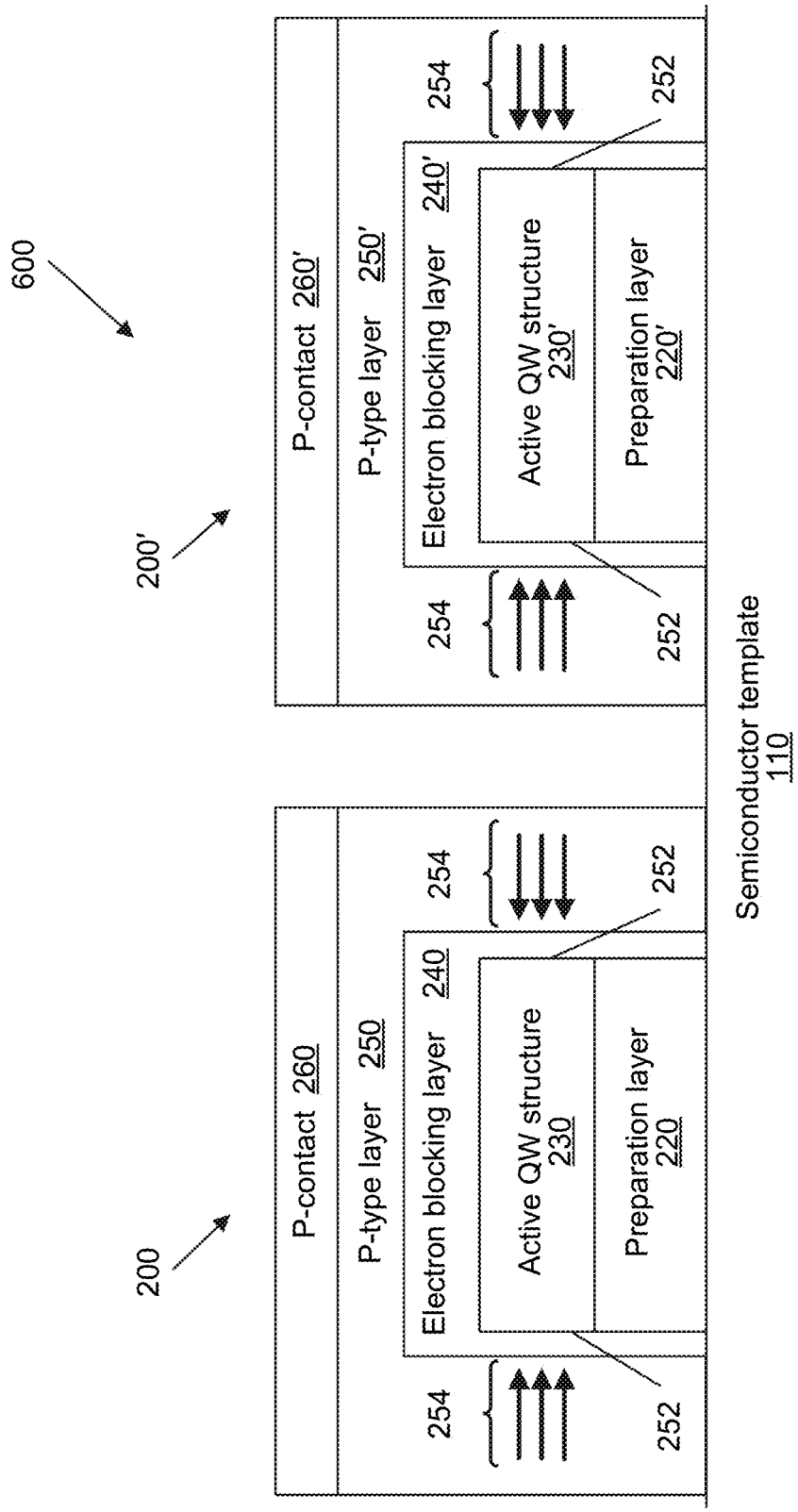
FIG. 6 illustrates an example of multiple quantum well-based LED structure enhanced with sidewall hole injection of the quantum well layers and supported on a single semiconductor template, in accordance with aspects of this disclosure.
Figure 7:
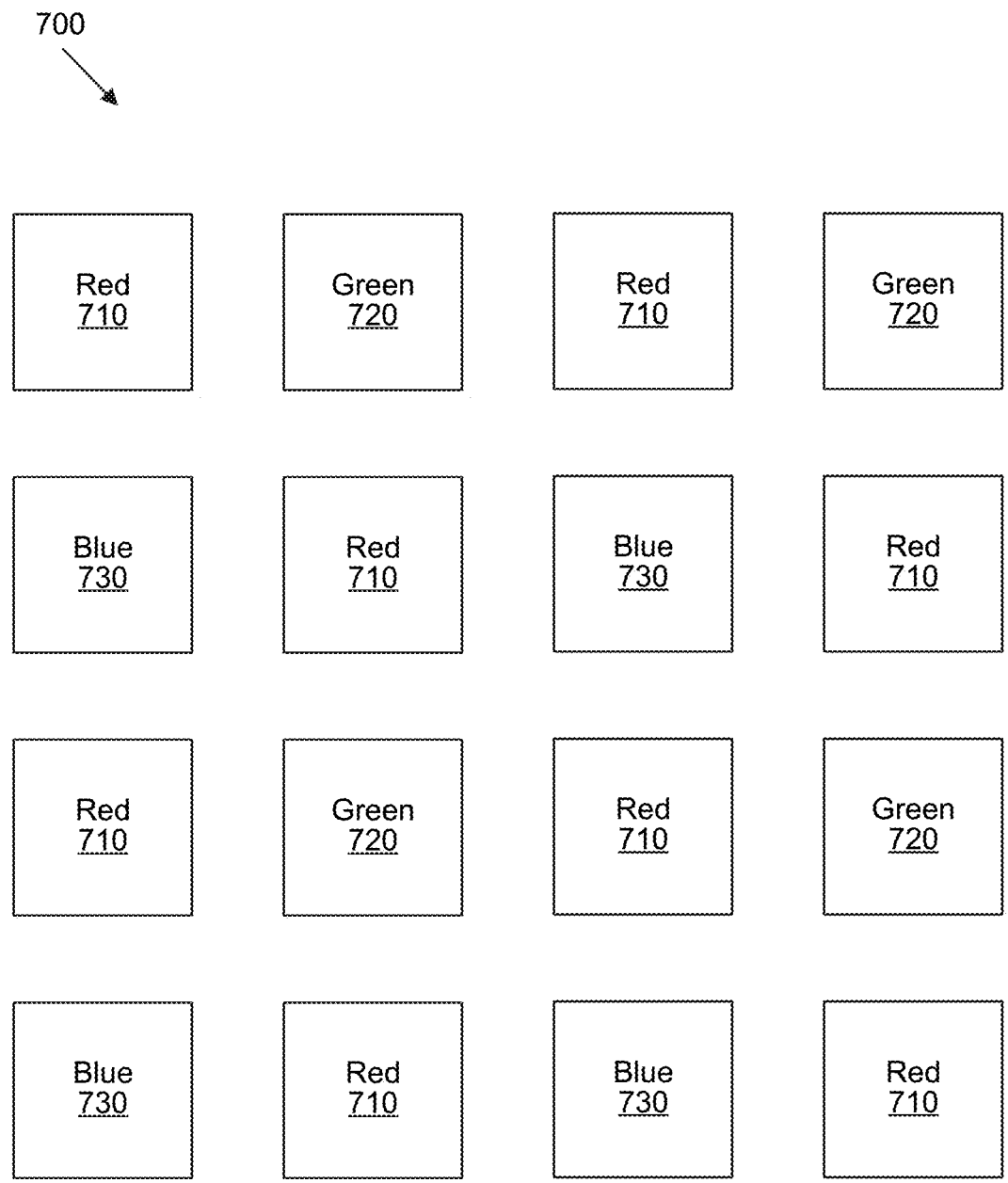
FIG. 7 illustrates a top view of multiple LED structures as part of an array, in accordance with aspects of this disclosure.

FIG. 6 illustrates an LED array 600 including QW-based LED structures enhanced with sidewall hole injection, in accordance with an embodiment. As shown in FIG. 6, LED array 600 includes LED structure 200 (as described in reference to FIG. 2). A second LED structure 200' is also included in LED array 600. As shown, LED structure 200' includes a preparation layer 220', an active QW structure 230', an electron blocking layer 240', a p-type layer 250', and a p-contact 260'. LED structure 200' may be structurally identical to LED structure 200 such that they exhibit essentially similar light emission characteristics at a similar wavelength. Alternatively, LED structure 200' may include different material compositions (e.g., different materials used in the preparation layer, active QW structure, etc.) such that LED structure 200' exhibits different light emission characteristics from LED structure 200 while still taking advantage of the same sidewall hole injection mechanism as LED structure 200. A top view of exemplary LED array 700, including an array of LED structures 710, 720, and 730 emitting at red, green, and blue wavelengths, respectively, is shown in FIG. 7.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims.

What is claimed is:

1. A light-emitting diode (LED) structure, comprising:
a semiconductor template having a planar growth surface;
an active quantum well (QW) structure disposed on the planar growth surface, the active QW structure having a sidewall that is non-parallel with the planar growth surface; and
a p-type layer conformally disposed over the active QW structure, the p-type layer having a surface that faces the sidewall of the active QW structure, the p-type layer terminating at and contacting the planar growth surface,
the surface of the p-type layer and the sidewall of the active QW structure being arranged such that, during operation of the LED structure, holes are injected from the p-type layer into the active QW structure through the surface of the p-type layer and into the active QW structure through the sidewall of the active QW structure in a direction parallel to the planar growth surface.

2. The LED structure of claim 1, wherein:
the active QW structure includes a plurality of QW layer and quantum barrier layer pairs formed parallel to the semiconductor template and stacked in a surface-normal direction relative to the planar growth surface, and
the surface of the p-type layer and the plurality of QW layer and quantum barrier layer pairs are arranged such that, during operation of the LED structure, holes are injected into each of the plurality of QW layers within the active QW structure through the sidewall of the active QW structure.

3. The LED structure of claim 2, wherein at least one of the quantum barrier layers in the active QW structure has a thickness greater than fifty nanometers in the surface-normal direction.

4. The LED structure of claim 1, further comprising a hole-blocking layer formed between the active QW structure and the semiconductor template, the hole-blocking layer, during operation of the LED structure, prevents migration of holes from the active QW structure to the semiconductor template.

5. The LED structure of claim 4, further comprising a preparation layer disposed between the semiconductor template and the hole-blocking layer.

6. The LED structure of claim 1, further comprising a p-contact layer disposed on the p-type layer.

7. The LED structure of claim 1, wherein, in a cross-sectional plane perpendicular to the planar growth surface, the LED structure forms a shape that is one of trapezoidal, triangular, or rectangular.

8. A method for fabricating a light-emitting diode (LED) structure on a semiconductor template, the semiconductor template having a planar growth surface, the method comprising:
forming an active quantum well (QW) structure over planar growth surface, the active QW structure having a sidewall that is non-parallel with the planar growth surface; and
forming a p-type layer conformally over the active QW structure, the p-type layer having a surface that faces the sidewall of the active QW structure, the p-type layer terminating at and contacting the planar growth surface,
the surface of the p-type layer and the sidewall of the active QW structure being arranged such that, during operation of the LED structure, holes are injected from the p-type layer into the active QW structure through the surface of the p-type layer and into the active QW structure through the sidewall of the active QW structure in a direction parallel to the planar growth surface.

9. The method of claim 8, further comprising:
forming a hole-blocking layer between the active QW structure and the semiconductor template for preventing migration of the holes from the active QW structure to the semiconductor template.

10. The LED structure of claim 1, wherein the semiconductor template is n-doped.

11. The LED structure of claim 10, wherein the p-type layer is in direct contact with the planar growth surface.

* * * * *